United States Patent
Xie et al.

(10) Patent No.: US 9,341,696 B2
(45) Date of Patent: May 17, 2016

(54) METHOD, SYSTEM, AND CONTROL APPARATUS FOR SETTING OVER-CURRENT PROTECTION POINT OF ELECTRONIC DEVICE

(71) Applicants: LiuQun Xie, Shanghai (CN); XiangRong Hu, Shanghai (CN)

(72) Inventors: LiuQun Xie, Shanghai (CN); XiangRong Hu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 183 days.

(21) Appl. No.: 13/845,997

(22) Filed: Mar. 18, 2013

(65) Prior Publication Data

US 2014/0002119 A1    Jan. 2, 2014

(30) Foreign Application Priority Data

Jun. 29, 2012    (CN) .......................... 2012 1 0220045

(51) Int. Cl.
  *G01R 35/00*    (2006.01)
  *H02H 3/00*    (2006.01)
  *H02H 3/08*    (2006.01)

(52) U.S. Cl.
  CPC ............. *G01R 35/007* (2013.01); *H02H 3/006* (2013.01); *H02H 3/08* (2013.01)

(58) Field of Classification Search
  CPC ................... G01R 31/318508; G01R 31/2801; G01R 31/2896; G01R 31/31901; G01R 31/27; G01R 31/07; G01R 31/327; G01R 31/28; G01R 31/02; G01R 22/00; G01R 22/10; G01R 19/2513; G01R 19/165; G01R 19/2506; G01R 19/252; G01R 19/25; G01R 19/255; G01R 19/277; G01R 19/2516; G01R 5/00; G01R 35/007; G01R 35/00; G01R 35/005; G01R 35/002; H02B 13/065; H02H 3/04; H02H 3/006; H02H 3/08; H03K 17/18; H03K 17/00; H01L 23/02; H01L 23/28; G05F 1/10; H02M 3/156
  USPC ................ 324/750.02; 323/281–282; 361/17, 361/21.02
  See application file for complete search history.

(56) References Cited

U.S. PATENT DOCUMENTS 6,385,547 B1 * 5/2002 Bogli ..................... G01R 15/04
                                                              324/600
7,595,615 B2 * 9/2009 Li et al. ......................... 323/277
(Continued)

FOREIGN PATENT DOCUMENTS

CN       1230301 A       9/1999
TW       200625746       7/2006
(Continued)

*Primary Examiner* — Melissa Koval
*Assistant Examiner* — Felicia Farrow
(74) *Attorney, Agent, or Firm* — CKC & Partners Co., Ltd.

(57) ABSTRACT

A method, a system, and a control apparatus for setting an over-current protection point of an electronic device are provided. The method comprises: step 1, the parameter auto-test equipment transmitting a starting signal and outputting a target current for over-current protection based on the auto-adjustment control unit; step 2, the first driving signal generator receiving the starting signal and transmitting a driving signal to the over-current protection module; and step 3, the electronic device receiving the target current for over-current protection, and the over-current protection module receiving the driving signal and adjusting a resistance of the resistance adjusting unit to the over-current protection point of the electronic device. The invention attains fully automatic operation on the over-current protection point of the electronic device, improves stability and consistency of setting the over-current protection point, and saves labor cost at the same time.

11 Claims, 5 Drawing Sheets

(56) References Cited

U.S. PATENT DOCUMENTS

| | | | |
|---|---|---|---|
| 8,233,256 B2 * | 7/2012 | Mehas | H02M 1/32 361/93.2 |
| 2006/0109039 A1 * | 5/2006 | Wu | 327/172 |
| 2007/0064460 A1 * | 3/2007 | Siman-Tov | 363/132 |
| 2009/0021233 A1 * | 1/2009 | Hsu | 323/290 |
| 2009/0040675 A1 * | 2/2009 | Abudul Muthalib et al. | 361/87 |
| 2010/0213908 A1 * | 8/2010 | Chen | 323/281 |
| 2010/0254055 A1 * | 10/2010 | Vanderzon | 361/87 |
| 2010/0315846 A1 * | 12/2010 | Lin | 363/50 |
| 2012/0049823 A1 * | 3/2012 | Chen | H02M 1/36 323/282 |

FOREIGN PATENT DOCUMENTS

| | | |
|---|---|---|
| TW | 201032014 A1 | 9/2010 |
| WO | WO 9802947 A1 * | 1/1998 |

\* cited by examiner

METHOD, SYSTEM, AND CONTROL APPARATUS FOR SETTING OVER-CURRENT PROTECTION POINT OF ELECTRONIC DEVICE

CROSS-REFERENCE TO RELATED APPLICATIONS

This non-provisional application claims priority under 35 U.S.C. §119(a) on Patent Application No. 201210220045.0 filed in P.R. China on Jun. 29, 2012, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the present invention described herein. All references listed, cited and/or discussed in this specification are incorporated herein by reference in their entireties and to the same extent as if each reference was individually incorporated by reference.

FIELD OF THE PRESENT APPLICATION

The present application relates to a manufacturing field of an electronic device, and more particularly to a method, a system, and a control apparatus for setting an over-current protection point of an electronic device.

BACKGROUND OF THE PRESENT APPLICATION

With various electronic devices being widely used, higher requirement is proposed on operative stability of the electronic devices.

Many electronic devices have a rated current for operation, if an operating current of the electronic device at present exceeds the rated current, it would cause the electronic device to stop operation and even to be damaged.

In prior art, in order to lower a loss resulted from that the operating current exceeds the rated current, an over-current protection module is general provided at an output terminal of a switch power supply of an electronic device. When an output current of the switch power supply exceeds the rated current, the over-current protection module starts an over-current protection function, i.e. automatically turns off the power supply by means of circuit characteristics thereof, so as to avoid exceeding current from flowing into other operating circuits of the electronic device, which will damage the circuit and yield loss. Therefore, a current which is slightly higher than the rated current and just able to start the over-current protection function of the over-current protection module is a target current for over-current protection of each electronic device.

The target current for over-current protection of the each electronic device corresponds to one over-current protection point of a resistance of the over-current protection module of said electronic device. Therefore, for each electronic device, when an operating current of the electronic device exceeds or is equal to the target current for over-current protection, the over-current protection module is actuated to start by adjusting a resistance of a resistor in the over-current protection module, so as to function as protecting the electronic device.

For an example described here, the electronic device is a switch power supply. During manufacturing process of the switch power supply in prior art, a variable resistor VR is generally provided in the over-current protection module of the switch power supply, for manually adjusting the resistance of the resistor. In a producing line, the over-current protection (OCP) point of the electronic device is actuated by adjusting the resistance value of the variable resistor VR, and the OCP point which has been set is secured by applying glue to the variable resistor VR.

FIG. 1 is a flow chart diagram illustrating a conventional method for setting an over-current protection point of an electronic device, which comprises:

step S1: setting a target current for over-current protection for a direct-current electronic load;

step S2: connecting a switch power supply which is not assembled with a housing to the electronic load and keeping an electronic supply from the switch power supply to the electronic load with a current equal to the target current for over-current protection;

step S3: continuously turning the resistance variable resistor VR in the over-current protection module of the switch power supply until the resistance reaches an OCP actuation point, where the operation current exceeds the target current for over-current protection, so that the over-current protection module is actuated to perform over-current protection, so as to cutoff the electronic supply from the switch power supply to the electronic load;

step S4: applying a fixing glue to the resistance variable resistor VR to fix the resistance of the resistance variable resistor VR at the currently actuated OCP point, so as to prevent the resistance of the variable resistor VR from changing.

However, each of the above steps is performed manually, which slows operating speed and seriously blocks promotion of productivity. At the same time, it is difficult for manual operation to assure higher correctness, because it is easily to manually change the resistance of the variable resistor VR. Moreover, since the fixing glue may shrink during cooling and may expand during heating, it is easily to have the secured resistance of the variable resistor VR displaced and offset from the OCP point which has been set, seriously affecting the quality of the electronic device.

SUMMARY OF THE PRESENT APPLICATION

One objective of the present application is to realize an auto-setting of the over-current protection point of an electronic device and obtain a higher correctness of the set over-current protection point.

According to one aspect of the invention, a method for setting an over-current protection point of an electronic device is provided. Said method can be applied in a system for setting the over-current protection point of the electronic device, which comprises a parameter auto-test equipment, a first driving signal generator, and said electronic device. The electronic device comprises an over-current protection module provided with a resistance adjusting unit. The parameter auto-test equipment is connected with the first driving signal generator, and is provided with an auto-adjustment control unit. Said method comprises steps of:

step 1, the parameter auto-test equipment transmitting a starting signal and outputting a target current for over-current protection based on the auto-adjustment control unit;

step 2, the first driving signal generator receiving the starting signal and transmitting a driving signal to the over-current protection module; and step 3, the electronic device receiving the target current for over-current protection, and the over-current protection module receiving the driving signal and adjusting a resistance of the resistance adjusting unit to the over-current protection point of the electronic device.

The electronic device can be a switch power supply.

According to a second aspect of the invention, a system for setting an over-current protection point of an electronic device is also provided, which comprises:

a parameter auto-test equipment provided with an auto-adjustment control unit for controlling the parameter auto-test equipment to transmit a starting signal and output a target current for over-current protection;

an electronic device comprising an over-current protection module provided with a resistance adjusting unit, wherein the electronic device is arranged for receiving the target current for over-current protection while the over-current protection module is arranged for receiving a driving signal; and a first driving signal generator for receiving the starting signal and transmitting the driving signal to the over-current protection module, wherein the driving signal drives the resistance adjusting unit to adjust its resistance to the over-current protection point of the electronic device.

The system further comprises a second driving signal generator for receiving the starting signal transmitted from the parameter auto-test equipment and sending a re-operating shielding signal to the over-current protection module. The over-current protection module retains the present resistance of the resistance adjusting unit unchanged.

The first driving signal generator and/or the second driving signal generator are integrated to the parameter auto-test equipment.

According to a third aspect of the invention, a control apparatus for setting an over-current protection point of an electronic device is further provided. Said control apparatus is electrically connected with a control and/or power circuit of the electronic device. The control apparatus comprises an over-current protection module comprising a resistance adjusting unit. The over-current protection module is arranged for receiving a driving signal to adjust a resistance of the resistance adjusting unit to the over-current protection point of the electronic device, at the same time when the electronic device receives a target current for over-current protection.

The electronic device can be a switch power supply provided with a power management chip.

The over-current protection module is integrated inside the power management chip.

The over-current protection module can shared pins with the power management chip.

The resistance adjusting unit can be a digital resistance unit of which a resistance is adjustable.

The digital resistance unit comprises a plurality of resistors which are interconnected with each other. The digital resistance unit adjusts its resistance of the digital resistance unit by receiving the driving signal and fusing a selected parts of the interconnections between the plurality of resistors.

The present invention attain an auto-adjustment on the resistance of the resistor in the over-current protection module by means of the driving signal generator, the parameter auto-test equipment provided with the auto control adjust unit and the driving signal outputted by the driving signal generator, so that the auto-setting of the over-current protection point of the electronic device is attained. Therefore, technical contents which are disclosed by the invention can attain fully automatic operation on the over-current protection point of the electronic device, save labor cost, and improve stability or consistency of setting the over-current protection point.

DESCRIPTION OF THE PREFERRED EMBODIMENTS

The invention discloses a method, a system, and a control apparatus for setting an over-current protection point of an electronic device, so as to attain auto-setting of the over-current protection point of the electronic device.

In a first aspect of the invention, a method for setting an over-current protection point of an electronic device is disclosed, which will be described with the reference of a structural diagram of a system for setting an over-current protection point of an electronic device shown in FIG. 2 as an example. The system 100 comprises a parameter auto-test equipment (ATE) 10, an electronic device 20, and a first driving signal generator 31.

Figure 1:
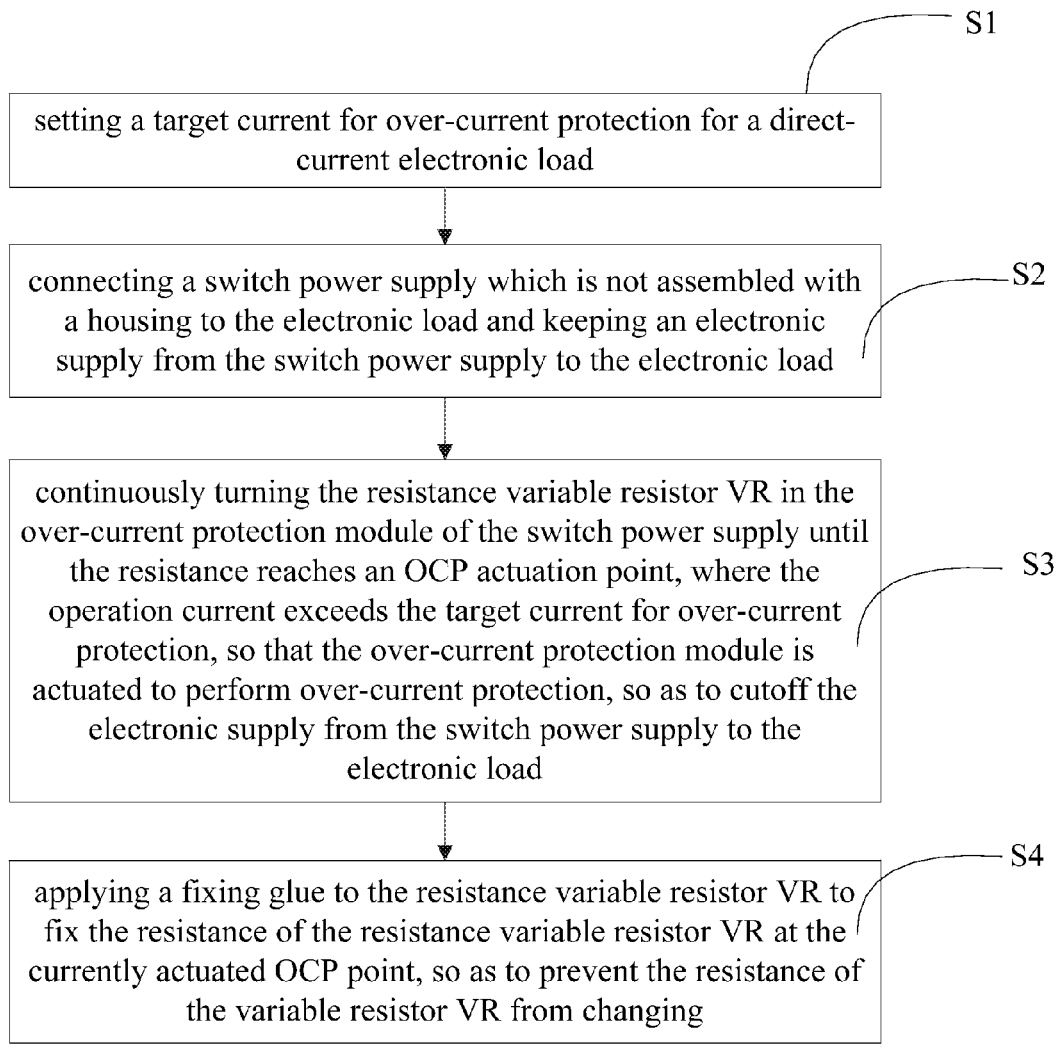
FIG. 1 is a flow chart diagram illustrating a conventional method for setting the over-current protection point of the electronic device.
Figure 2:
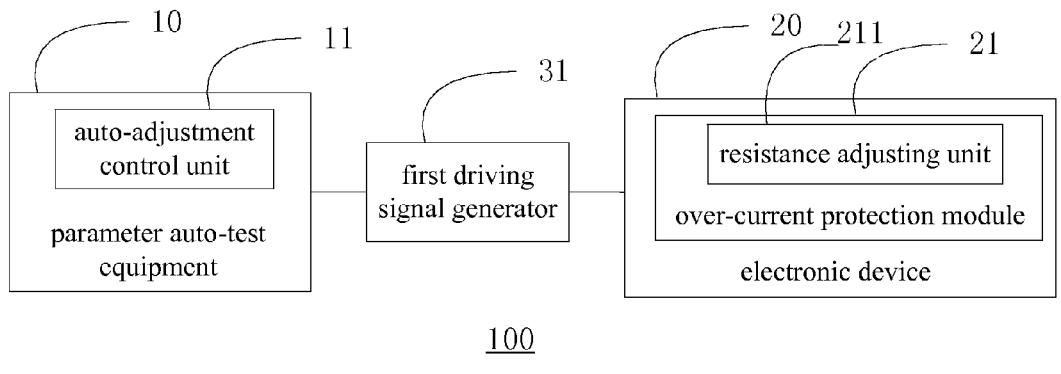
FIG. 2 is a structural diagram illustrating the system for setting the over-current protection point of the electronic device according to the invention.

As shown in FIG. 2, the parameter auto-test equipment 10 is provided with an auto-adjustment control unit 11. The electronic device 20 comprises an over-current protection module 21. The over-current protection module 21 is provided with a resistance adjusting unit 211 therein. The first driving signal generator 31 is connected with the parameter auto-test equipment 10.

Figure 3:
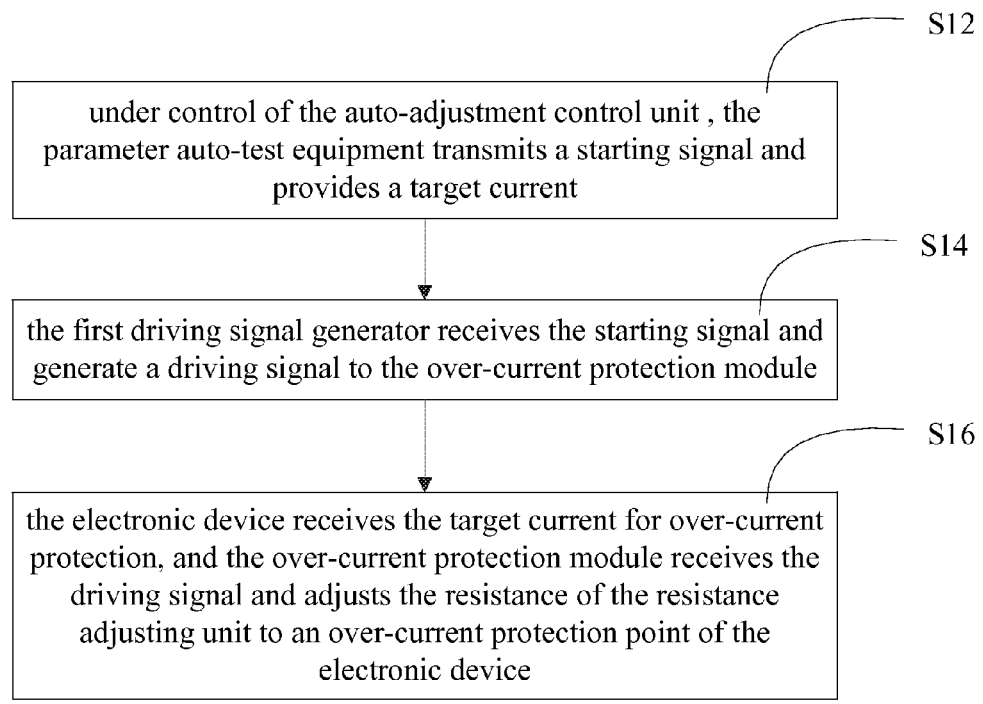
FIG. 3 is a flow chart diagram illustrating the method for setting the over-current protection point of the electronic device according to the invention.

As shown in FIG. 3, the method for setting the over-current protection point of the electronic device is exemplarily described as follows. In step S12, under control of the auto-adjustment control unit 11, the parameter auto-test equipment 10 transmits a starting signal to the first driving signal generator 31 while provides a target current for an over-current protection for the electronic device 20. In step S14, the first driving signal generator 31 receives the starting signal and generate a driving signal to the over-current protection module 21. In step S16, the over-current protection module 21 receives the driving signal and adjusts the resistance of the resistance adjusting unit 211 to an over-current protection point of the electronic device 20.

The method for setting the over-current protection point will be further described with an exemplary embodiment where the electronic device 20 is a switch power supply. In order to assure that the switch power supply is able to properly perform the adjustment on the over-current protection point, before automatically setting the over-current protection point of the switch power supply (i.e. before the step S12), the parameter auto-test equipment is utilized to determine whether the switch power supply will perform a protection before setting the over-current protection point. Therefore, after the step S16, based on the auto-control unit 11, the parameter auto-test equipment will test and judges the output of the switch power supply for which the over-current protection has been automatically adjusted. In particularly, the parameter auto-test equipment tests the output of the switch power supply based on the auto-adjustment control unit. The setting of the over-current protection point of the switch power supply is successful when the output of the switch power supply is in conformity with a predetermined range, while the setting the over-current protection point of the switch power supply is failure when the output of the switch power supply is not in conformity with the predetermined range. During manufacturing process of the switch power supply, in addition to setting the over-current protection point, test on other relevant parameters should be also performed. Therefore, in this situation, when the over-current protection point of the switch power supply shown in FIG. 3 is set completely, the parameter auto-test equipment tests the output of the switch power supply based on the auto-adjustment control unit. When the output is in conformity with the predetermined range, the parameter auto-test equipment will further test predescribed electrical parameter(s) of the switch power supply. When the output is not conformity with the predetermined range, the parameter auto-test equipment will finish the test. Generally speaking, when the switch power supply implements the over-current protection action, its outputted electrical signal (for example, voltage) will be reduced to a quite lower degree (for example, close to zero). Therefore, success or unsuccess of the setting of the over-current protection point at this time can be judged according to the change of the outputted electrical signal of the switch power supply.

Figure 4:
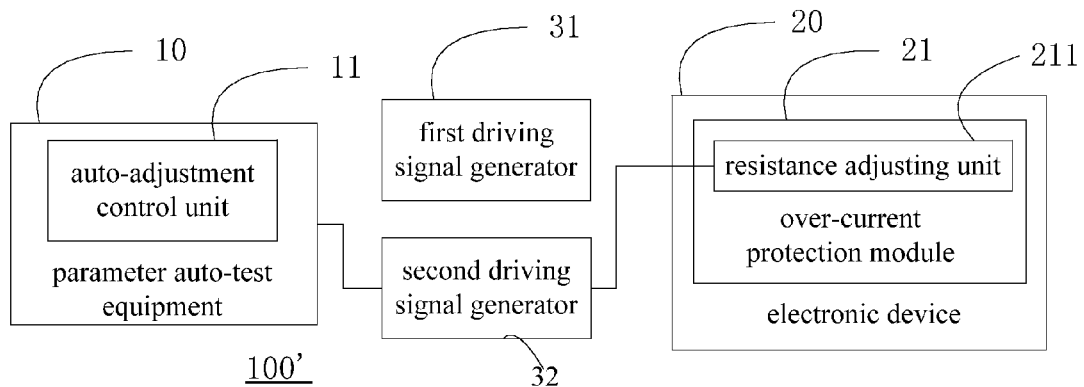
FIG. 4 is a structural diagram illustrating the system for setting the over-current protection point of the electronic device according to another embodiment of the invention.
Figure 5:
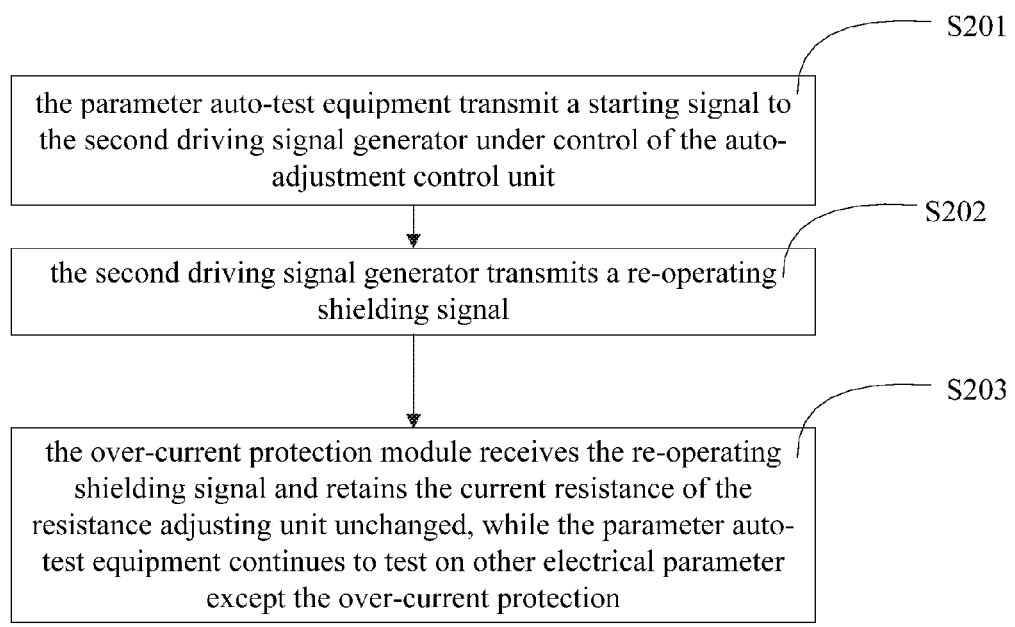
FIG. 5 is a flow chart diagram illustrating the method for setting an over-current protection point of a switch power supply according to the invention.

Moreover, during the manufacture of the switch power supply, it generally happens that, while the OCP point of the switch power supply is set successfully, the test on other testing items is failure or beyond a standard during a subsequent test. At this time, the switch power supply needs to return to a producing line for a re-adjustment. After the switch power supply is re-adjusted, a setting system 100' as shown in FIG. 4 can be employed, if the setting of the OCP point of the switch power supply need not be adjusted again while only other predescribed electrical parameters of the switch power supply need to be tested. A configuration of the setting system 100' different from a configuration of the OCP setting system in FIG. 2 lies in that the parameter auto-test equipment 10 transmits a starting signal to a second driving signal generator 32. With respect to this situation, steps performed by the whole setting system 100' are shown in FIG. 5 and in combination with FIG. 4. In step S201, the parameter auto-test equipment 10 transmit a starting signal to the second driving signal generator 32 under control of the auto-adjustment control unit. In step S202, the second driving signal generator 32 transmits a re-operating shielding signal. In step S203, the over-current protection module 21 receives the re-operating shielding signal and retains the present resistance of the resistance adjusting unit 211 unchanged, while the parameter auto-test equipment continues to test on other electrical parameter except the over-current protection.

In a second aspect of the invention, a system for setting an over-current protection point of an electronic device is provided. The aforesaid setting method for the over-current protection point of the electronic device can be realized based on the setting system provided by this second aspect of the invention. The setting system comprises the parameter auto-test equipment, the electronic device, and the first driving signal generator. As shown in FIG. 3, during testing, the automatic setting of the over-current protection point of the electronic device is performed by the whole system, which has been described in the content of the first aspect of the invention in terms of example and will not be repeated here.

Herein description will be made by still taking the example where the electronic device is a switch power supply. As set forth above, the switch power supply not only has requirement to setting an over-current protection point but also at the same time has requirement to test other parameters. Therefore, in order to avoid from adding a new device for independently performing the auto-setting of the over-current protection point of the switch power supply or to reduce test procedure on the switch power supply, the system for setting the over-current protection point disclosed according to the second aspect of the invention can perform the auto-setting of the over-current protection point of the switch power supply by means of the parameter auto-test equipment for testing other parameters of said switch power supply. However, the parameter auto-test equipment is provided with testing program for testing other predescribed parameters of the switch power supply so as to control the parameter auto-test equipment to test the other predescribed parameters of the switch power supply. Therefore, in order to attain the auto-setting of the over-current protection point by means of the parameter auto-test equipment, an auto-adjustment control unit needs to be added into the parameter auto-test equipment and join with the testing program for testing other parameter, so as to control said parameter auto-test equipment to complete the auto-setting of the OCP point of the switch power supply. Before the auto-adjustment control unit joins with the testing program for testing other parameter, the success or unsuccess of the setting of the over-current protection point may affect the subsequent test on other electrical parameter of the switch power supply. For example, the parameter auto-test equipment tests the output of the switch power supply based on the auto-adjustment control unit, and then continues to test other predescribed parameter of the switch power supply when the output is in conformity within a predetermined range, or finishes the test when the output is not in conformity with said predetermined range. Certainly, the auto-adjustment control unit may be provided in middle of or at final of the whole test procedures, which depends on actual requirements that can be various.

As in the case that is set forth in the content of the first aspect of the invention, where the OCP point of the switch power supply is set successfully but test on other testing item during a subsequent testing procedure is failure or beyond a standard, the switch power supply then needs to return to the producing line for being re-adjusted. After the switch power supply is re-adjusted, only other predescribed electrical parameters of the switch power supply need be tested when the setting of the OCP point of said switch power supply need not be further adjusted. With respect to this case, the whole setting system can be provided with a second driving signal generator to solve the above-mentioned problem, which has been described in the content of the first aspect of the invention and relevant description of which is omitted herein.

For the setting system 100' as shown in FIG. 4, the first driving signal generator 31 can be provided within or outside the parameter auto-test equipment 10, which depends on specific actual requirement. The second driving signal generator 32 can also be provided within or outside the parameter auto-test equipment 10, which depends on the type of the parameter auto-test equipment 10 and/or actual requirement.

In addition, in content of a third aspect of the invention, a control apparatus for setting an over-current protection point of the electronic device is disclosed. The control apparatus comprises an over-current protection module electrically connected with a control and/or power circuit of the electronic device. As described in the above embodiments, the over-current protection module is provided with a resistance adjusting unit. While the electronic device receives the target current for over-current protection provided by the parameter auto-test equipment as in the above-mentioned embodiments, the over-current protection module may receive a driving signal so as to perform an adjustment for the resistance of the resistance adjusting unit of the over-current protection module until the resistance of the resistance adjusting unit actuates the electronic device to perform over-current protection. Therefore, the control apparatus is also an indispensable part for auto-setting the over-current protection point of the electronic device.

Hereinafter, the description will be made by taking an example where the electronic device is still a switch power supply. The switch power supply can further comprise a power management chip. The over-current protection module and the power management chip can be two independent chips. Alternatively, the over-current protection module can be integrated inside the power management chip. Thanks to that the over-current protection module is integrated inside the power management chip, the structure of the switch power supply can be simplified. Furthermore, the over-current protection module can share pins with the power management chip. For example, the pins on the power management chip may be served respectively as the pins for the over-current protection module and the pins for the power management chip itself during different periods, so that the over-current protection module and the power management chip can share pins. When the over-current protection module shares pins with the power management chip, the number of the pins of the power management chip may be reduced. Moreover, the packaging process for the power management chip of the invention may be compatible to the conventional packaging process for the power management chip.

Figure 6:
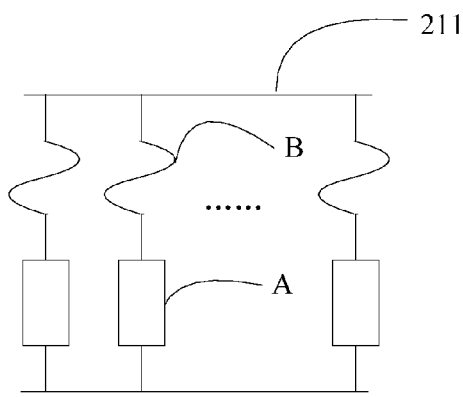
FIG. 6 is a structural diagram of the resistance adjusting unit.

The resistance adjusting unit in the over-current protection module can be a digital resistance unit. As shown in FIG. 6, the digital resistance unit may comprise a plurality of resistors interconnected to each other. The digital resistance unit receives a driving signal so as to selectively fuse a part of connections between the plurality of resistors, so that the adjustment on the resistance of the digital resistance unit is attained. Each of the resistance units has two statuses, i.e. a fused status and a non-fused status, which respectively corresponds to a "0" state and a "1" state of a digital signal. When the number of similar resistance units (i.e. the number of bits) is more, the total number of the possible equivalent resistances is also more, which means that the precision of setting the over-current protection point is higher. However, a specific structure of the resistance adjusting unit 211 can be also attained by other manner of a digital circuit, such as by a combination of a connection in serial and a connection in parallel, which falls within a scope of the invention. Generally, the number of adjustments on such digital resistance is limited. After being adjusted for a limited times, the digital resistance unit can not change its resistance even when the over-current protection module receives the driving signal. Therefore, in the cases that the digital resistance of the over-current protection module need not be adjusted as described in the first and the second aspects of the invention, a re-operating shielding signal can be transmitted to the over-current protection module to avoid the digital resistance unit from being adjusted. Said driving signal can be a driving signal generated by the first driving signal generator as set forth above. However, when the over-current protection module receives the re-operating shielding signal generated by the second driving signal generator as set forth above, the re-operating shielding signal can not drive the adjustment on the resistance of the digital resistance unit. Therefore, it is possible to distinguish the re-operating shielding signal from the driving signal by various manners, such as by different voltage amplitudes, different frequencies, different currents, or a combination of the previous three manners. As long as a signal received is not matched with the driving signal, the digital resistance unit can not be enabled to perform adjustment on the resistance. As can be seen from the above contents, the type of the driving signal received by the over-current protection module may be set according to the type of the digital resistance unit.

According to the invention, the auto-adjustment on the resistance of the resistor in the over-current protection module is realized by means of the first driving signal generator and the parameter auto-test equipment provided with the auto control adjust unit and the driving signal outputted by the first driving signal generator, so that the auto-setting of the over-current protection point of the electronic device is attained. Therefore, the technical content disclosed by the invention attains a fully automatic operation on the over-current protection point of the electronic device, saving labor cost, and improving the stability and or consistency of setting the over-current protection point.

APPLICATION EXAMPLE

The invention which is disclosed above will be further described hereinafter by a specific application example of the method and the system for the over-current protection point of the electronic device disclosed by the above embodiments.

In this specific application example, the electronic device is a switch power supply, such as a switch power supply in a computer mainframe. During the manufacture of the switch power supply, in addition to other testing items that are conventionally required to be tested, the over-current protection point is further required to be set and tested so as to attain a self-protection function of the product itself.

Figure 7:
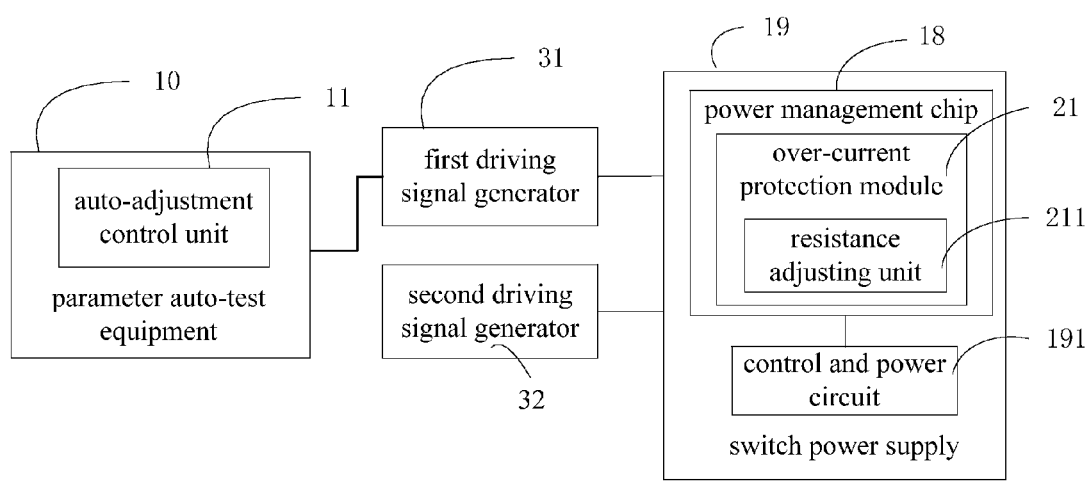
FIG. 7 is a structural diagram illustrating the system for setting the over-current protection point of the switch power supply.

Referring to FIG. 7, a specific block diagram illustrating the whole setting system of the specific application example, the whole setting system comprises a control apparatus for setting the over-current protection point of the electronic device. The setting system comprises a parameter auto-test equipment 10. The auto-testing processes of the parameter auto-test equipment 10 is provided with an auto-adjustment control unit 11. The setting system further comprises a first driving signal generator 31, a second driving signal generator 32, and a switch power supply 19. The switch power supply 19 comprises a power management chip 18. The power management chip 18 comprises an over-current protection module 21. The over-current protection module 21 comprises a resistance adjusting unit 211. The switch power supply 19 further comprises a control and power circuit 191 of the switch power supply, which is connected with the power management chip.

Figure 8:
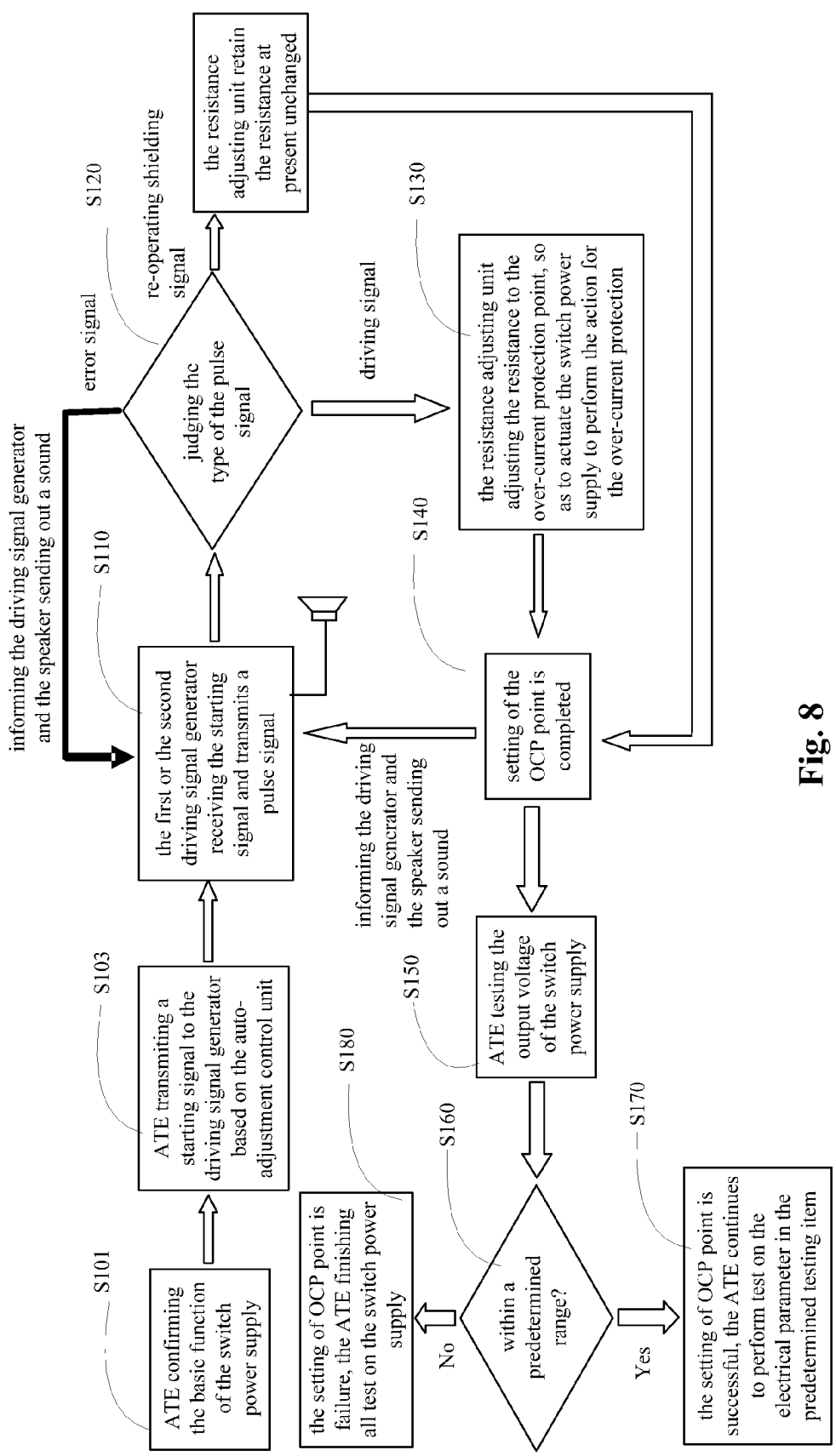
FIG. 8 is a detailed flow chart diagram illustrating the method for setting an over-current protection point according to the invention.

FIG. 8 illustrates a flow chart of the auto-setting of the over-current protection point of the switch power supply with the reference of FIG. 7.

In step S101, the auto-test equipment (ATE) confirms the basic function of the switch power supply and judges whether the over-current protection point has been protected before it was set. If the basic function of the switch power supply is normal, the subsequent auto-setting of the over-current protection point is performed, or else, any subsequent action to be performed on the switch power supply stops.

In step S103, the ATE transmits a starting signal to the driving signal generator based on the auto-adjustment control unit. For example, in this step, based on the auto-adjustment control unit, a TTL port of the ATE receives a "H" instruction, so that the ATE generates a high electrical level signal to the driving signal generator and at the same time provides a target current for the over-current protection to the switch power supply.

In step S110, the starting signal transmitted from the ATE in the step S103 is received by the first driving signal generator 31 when the auto-adjustment on the over-current protection needs to be performed, or by the second driving signal generator 32 when the auto-adjustment on the over-current protection needs not to be performed. The reason why two types of the driving signal generators exist has been described in the above embodiments and is not repeated herein. In the step S110, which driving signal generator is utilized to receive the starting signal of the ATE is manually judged according to a process history record of the switch power supply.

In step S120, the power management chip 18 of the switch power supply 19 judges the received signal that is transmitted by the driving signal generator. If the received signal is a re-operating shielding signal transmitted by the second driving signal generator 32, the resistance adjusting unit 211 of the over-current protection module 21 in the power management chip 18 will retain the present resistance unchanged until to the step S140. If the received signal is a driving signal transmitted by the first driving signal generator 31, the resistance adjusting unit 211 of the over-current protection module 21 in the power management chip 18 will perform the step S130. In practical operation, the signal received by the power management chip 18 may be neither the driving signal nor the re-operating shielding signal. Then, the power management chip 18 generates an error signal to the driving signal generator. The driving signal generator connected with a speaker will sent out a long audible sound to warn an operator that there is an error on the current driving signal generator and warn the operator to place another driving signal generator which operates properly.

In step S130, the resistance adjusting unit 211 of the over-current protection module 21 in the power management chip 18 adjusts the resistance to the over-current protection point, so as to actuate the switch power supply 19 to perform the action for the over-current protection.

In step S140, when the switch power supply 19 completes the setting of the over-current protection point, the switch power supply 19 transmits a finish signal to inform the driving signal generator. When the driving signal generator receives this signal, the speaker sends out a short audible sound to warn the operator that the auto-setting of the over-current protection point is completed.

In step S150, the ATE tests the output voltage of the switch power supply 19 at the same time when the step S140 is carrying on.

In step S160, the ATE judges whether the output voltage of the switch power supply 19 is in a predetermined range. If so, the setting of the over-current protection point is considered as successful, and the test on other testing item can be subsequently performed. If not, the setting of the over-current protection point is considered as failure. The test finishes and an error message is generated. For example, the parameter auto-test equipment 10 can continue to test an output of the switch power supply 19 (e.g. an output voltage) under the control of the auto-adjustment control unit 11. If the output voltage is in a predetermined range, for example less than 0.4 V, the setting of the over-current protection point is considered as successful and the step S170 will be performed. if the output voltage is not in the predetermined range, for example greater than 0.4 V, the setting of the over-current protection point is considered as failure and the step S180 will be performed.

In step S170, the parameter auto-test equipment 10 continues to perform test on the electrical parameter in the predetermined testing item.

In step S180, the parameter auto-test equipment 10 finishes all test on the switch power supply 19.

In this application example, the auto-adjustment control unit 11 and an additional driving signal generator are added into the auto-testing processes of the parameter auto-test equipment 10. The over-current protection module is added into the power management chip 18 of the switch power supply 19. Therefore, the auto-setting of the over-current protection point of the switch power supply 19 is attained. Therefore, in comparison with traditionally manual setting of the over-current protection point of the switch power supply, this application example efficiently saves labor resource and improves stability and consistency of setting the over-current protection point.

What is claimed is:

1. A method for setting an over-current protection point of an electronic device, applied in a system for setting the over-current protection point of said electronic device, said system comprising a parameter auto-test equipment, a first driving signal generator, and the electronic device, the electronic device comprising an over-current protection module provided with a resistance adjusting unit, the first driving signal generator being connected with the electronic device, the parameter auto-test equipment being connected with the first driving signal generator and being provided with an auto-adjustment control unit, the method comprising:

step 1: the parameter auto-test equipment transmitting a starting signal and outputting a target current for over-current protection based on the auto-adjustment control unit;

step 2: the first driving signal generator receiving the starting signal and transmitting a driving signal to the over-current protection module;

step 3: the electronic device receiving the target current for over-current protection, and the over-current protection module receiving the driving signal and adjusting a resistance of the resistance adjusting unit to the over-current protection point of the electronic device; and step 4: the parameter auto-test equipment testing an output of the electronic device based on the auto-adjustment control unit, wherein the setting of the over-current protection point of the electronic device is successful if the output of the electronic device is in a predetermined range, while the setting of the over-current protection point of the electronic device is failure if the output of the electronic device is not in the predetermined range.

2. The method according to claim 1, wherein said system further comprising a second driving signal generator, and the method further comprising performing the following steps after the step 4 when the parameter auto-test equipment needs to re-operating the test, wherein:

step 5: the second driving signal generator transmitting a re-operating shielding signal;

step 6: the over-current protection module receiving the re-operating shielding signal to retain the present resistance of the resistance adjusting unit unchanged, while the parameter auto-test equipment continuing to test electrical parameters of the electronic device except the over-current protection.

3. The method according to claim 1, further comprising a step for confirming whether the electronic device is protected in advance before the step 1, wherein:

the parameter auto-test equipment providing the target current for over-current protection for the electronic device based on the auto-adjustment control unit, and testing an output of the electronic device to judge whether the electronic device is protected in advance, the parameter auto-test equipment finishing the test if the electronic device is protected in advance, or performing the step 1 if the electronic device is not protected in advance.

4. The method according to claim 1, wherein the resistance adjusting unit is a digital resistance unit of which the resistance is adjustable.

5. The method according to claim 1, wherein the electronic device is a switch power supply, and wherein the method is applied in the system for setting the over-current protection point of the switch power supply.

6. A system for setting an over-current protection point of an electronic device, comprising:

a parameter auto-test equipment provided with an auto-adjustment control unit for controlling the parameter auto-test equipment to transmit a starting signal and output a target current for over-current protection;

an electronic device comprising an over-current protection module provided with a resistance adjusting unit, wherein the electronic device is arranged for receiving the target current for over-current protection while the over-current protection module is arranged for receiving a driving signal;

a first driving signal generator for receiving the starting signal and transmitting the driving signal to the over-current protection module, wherein the first driving signal generator is connected with the electronic device;

wherein the driving signal drives the resistance adjusting unit to adjust its resistance to the over-current protection point of the electronic device; and wherein under a control of the auto-adjustment control unit, the parameter auto-test equipment tests an output of the electronic device after the adjusting of the resistance of the resistance adjusting unit is completed, to judge whether the setting of the over-current protection point of the electronic device is successful, the parameter auto-test equipment continuing to test a predetermined electrical parameter if the setting of the over-current protection point of the electronic device is successful, or else the parameter auto-test equipment finishing the test.

7. The system according to claim 6, wherein the resistance adjusting unit is a digital resistance unit.

8. The system according to claim 7, wherein the digital resistance unit comprises a plurality of resistors which are interconnected with each other, so that the digital resistance unit adjusts its resistance by fusing a part of connections between the plurality of resistors.

9. The system according to claim 6, further comprising a second driving signal generator for receiving the starting signal transmitted by the parameter auto-test equipment and transmitting a re-operating shielding signal to the over-current protection module, making the over-current protection module retain the present resistance of the resistance adjusting unit unchanged.

10. The system according to claim 9, wherein the first driving signal generator and/or the second driving signal generator are integrated to the parameter auto-test equipment.

11. The system according to claim 6, wherein the electronic device is a switch power supply.

* * * * *